US012149828B1

(12) United States Patent
Shahparnia

(10) Patent No.: US 12,149,828 B1
(45) Date of Patent: Nov. 19, 2024

(54) SCALABLE ACTUATOR DRIVER SYSTEM FOR A CAMERA

(71) Applicant: Apple Inc., Cupertino, CA (US)

(72) Inventor: Shahrooz Shahparnia, Monte Sereno, CA (US)

(73) Assignee: Apple Inc., Cupertino, CA (US)

( * ) Notice: Subject to any disclaimer, the term of this patent is extended or adjusted under 35 U.S.C. 154(b) by 112 days.

(21) Appl. No.: 17/935,004

(22) Filed: Sep. 23, 2022

Related U.S. Application Data

(60) Provisional application No. 63/248,332, filed on Sep. 24, 2021.

(51) Int. Cl.
| | |
|---|---|
| *H04N 23/68* | (2023.01) |
| *G01R 19/00* | (2006.01) |
| *G02B 7/02* | (2021.01) |
| *G02B 27/64* | (2006.01) |
| *G03B 5/00* | (2021.01) |
| *H04N 23/54* | (2023.01) |
| *H04N 23/67* | (2023.01) |

(52) U.S. Cl.
CPC ....... *H04N 23/687* (2023.01); *G01R 19/0046* (2013.01); *G02B 7/021* (2013.01); *G03B 5/00* (2013.01); *H04N 23/67* (2023.01); *G02B 27/646* (2013.01); *G03B 2205/0007* (2013.01); *G03B 2205/0069* (2013.01); *H04N 23/54* (2023.01)

(58) Field of Classification Search
CPC ...... H04N 23/687; H04N 23/67; H04N 23/54; G01R 19/0046; G02B 7/021; G02B 27/646; G03B 5/00; G03B 2205/0007; G03B 2205/0069
See application file for complete search history.

(56) References Cited

U.S. PATENT DOCUMENTS

| | | | |
|---|---|---|---|
| 9,453,816 B2 | 9/2016 | Morimoto | |
| 10,141,880 B2 | 11/2018 | Ninomiya | |
| 10,890,734 B1* | 1/2021 | Sharma | H02P 6/16 |
| 2005/0265705 A1* | 12/2005 | Uenaka | H04N 23/68 |
| | | | 348/E5.046 |
| 2019/0141248 A1* | 5/2019 | Hubert | H04N 23/687 |
| 2020/0120283 A1 | 4/2020 | Min | |
| 2021/0400176 A1* | 12/2021 | Kimura | H04N 23/687 |
| 2022/0224839 A1* | 7/2022 | Maede | H04N 23/683 |

* cited by examiner

*Primary Examiner* — Nhan T Tran
(74) *Attorney, Agent, or Firm* — Robert C. Kowert; Kowert, Hood, Munyon, Rankin & Goetzel, P.C.

(57) ABSTRACT

A camera may include an actuator driver system comprising at least two drivers to generate current for individual coils of one or more actuators of the camera. One driver may act as a primary driver, whilst the other may serve as a secondary driver. The primary driver may receive at last one command signal from a host and at last one measurement signal from a sensor. The primary driver may determine command current for the individual coils according to the command and measurement signals. The primary driver may distribute between the two drivers signals indicative of the determined current for the coils. Accordingly, the first and second drivers may respectively generate the current for the corresponding coils connected with the drivers to move at least one lens and/or an image sensor of the camera.

20 Claims, 10 Drawing Sheets

|  | Driver 145 (e.g., the primary driver) | Driver 150 (e.g., the secondary driver) |
|---|---|---|
| Input | AF sensor | |
| | SZ1 sensor | |
| | SZ2 sensor | |
| | OIS1 sensor | |
| | OIS2 sensor | |
| | temperature sensor | |
| | PWM/Linear mode selector | PWM/Linear mode selector |
| | serial data line (SDA) | serial data line (SDA) |
| | serial clock line (SCL) | serial clock line (SCL) |
| | UART RX | UART RX |
| Output | UART TX | UART TX |
| | OIS coil 125 | AF coil 115 |
| | OIS coil 126 | AF coil 120 |
| | OIS coil 127 | |
| | OIS coil 128 | |

| | Driver 345 (e.g., the primary driver) | Driver 350 (e.g., the secondary driver) |
|---|---|---|
| Input | AF sensor | |
| | OIS1 sensor | |
| | OIS2 sensor | |
| | temperature sensor | |
| | PWM/Linear mode selector | PWM/Linear mode selector |
| | serial data line (SDA) | serial data line (SDA) |
| | serial clock line (SCL) | serial clock line (SCL) |
| | UART RX | UART RX |
| Output | UART TX | UART TX |
| | OIS coil 325 | OIS coil 327 |
| | OIS coil 326 | OIS coil 328 |
| | AF coil 315 | |

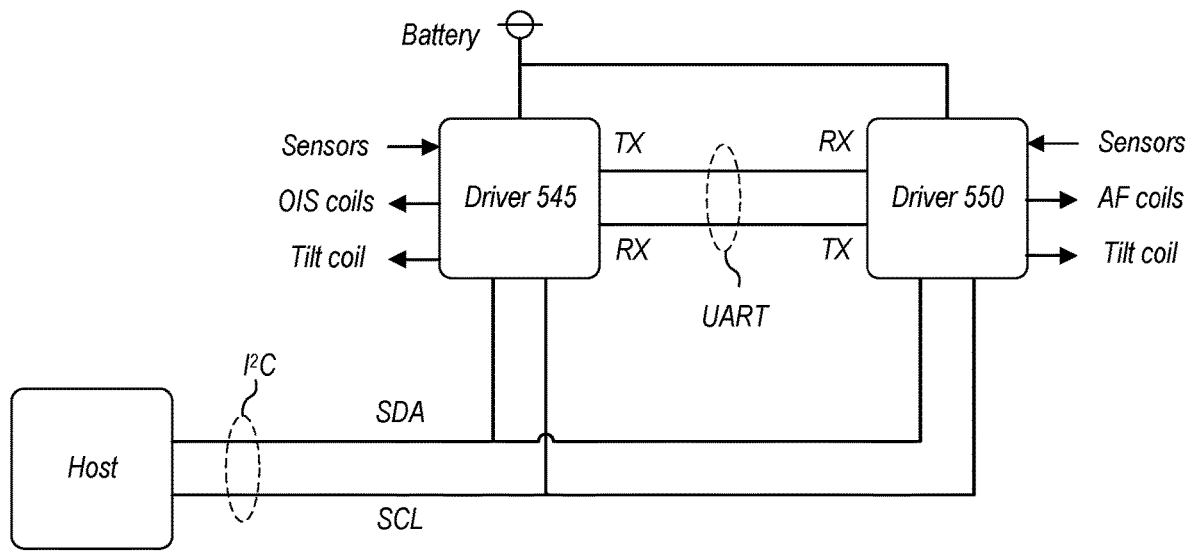

|  | Driver 545 (e.g., the primary driver) | Driver 550 (e.g., the secondary driver) |
|---|---|---|
| *Input* | OIS1 sensor | AF TY1 sensor |
|  | OIS2 sensor | AF TY2 sensor |
|  | SZ1 sensor | AF TX2 sensor |
|  | SZ2 sensor |  |
|  | AF TX1 sensor |  |
|  | temperature sensor |  |
|  | PWM/Linear mode selector | PWM/Linear mode selector |
|  | serial data line (SDA) | serial data line (SDA) |
|  | serial clock line (SCL) | serial clock line (SCL) |
|  | UART RX | UART RX |
| *Output* | UART TX | UART TX |
|  | OIS coil 525 | AF coil 515 |
|  | OIS coil 526 | AF coil 520 |
|  | Tilt coil 571 | Tilt coil 572 |
|  | Tilt coil 573 | Tilt coil 574 |

FIG. 6

SCALABLE ACTUATOR DRIVER SYSTEM FOR A CAMERA

This application claims benefit of priority to U.S. Provisional Application Ser. No. 63/248,332 entitled "Scalable Actuator Driver System for a Camera," filed Sep. 24, 2021, and which is hereby incorporated herein by reference in its entirety.

BACKGROUND

Technical Field

This disclosure relates generally to a camera and more specifically to a camera having a scalable actuator driver system.

Description of the Related Art

Mobile multipurpose devices such as smartphones, tablets, and/or pad devices are considered as a necessity nowadays. They integrate various functionalities in one small package thus providing tremendous convenience for use. Most, if not all, of today's mobile multipurpose devices include at least one camera. Some cameras may incorporate an optical image stabilization (OIS) mechanism that may sense and react to external excitation/disturbance by adjusting location of an image sensor relative to a lens of the camera in an attempt to compensate for unwanted motion of the lens. Furthermore, some cameras may incorporate an autofocus (AF) mechanism whereby the object focal distance between a lens and an image sensor can be adjusted to focus an object plane in front of the camera at an image plane to be captured by the image sensor. In addition, some cameras may include a tilt function that can rotate a lens to an angle relative to an image sensor to adjust the composition of an image captured by the image sensor. Generally, a camera may use an actuator, such as a voice coil motor (VCM) actuator, to adjust a relative position between a lens and an image sensor. With advent of the mobile multipurpose devices, a camera may now carry multiple actuators to implement a variety of different motion functions. Thus, it is desirable to have a driver system that is scalable and can be used to drive the actuators to implement different motion mechanisms.

BRIEF DESCRIPTION OF THE DRAWINGS

FIG. 6 shows another example actuator driver system of a camera, according to some embodiments.

Figure 1A:
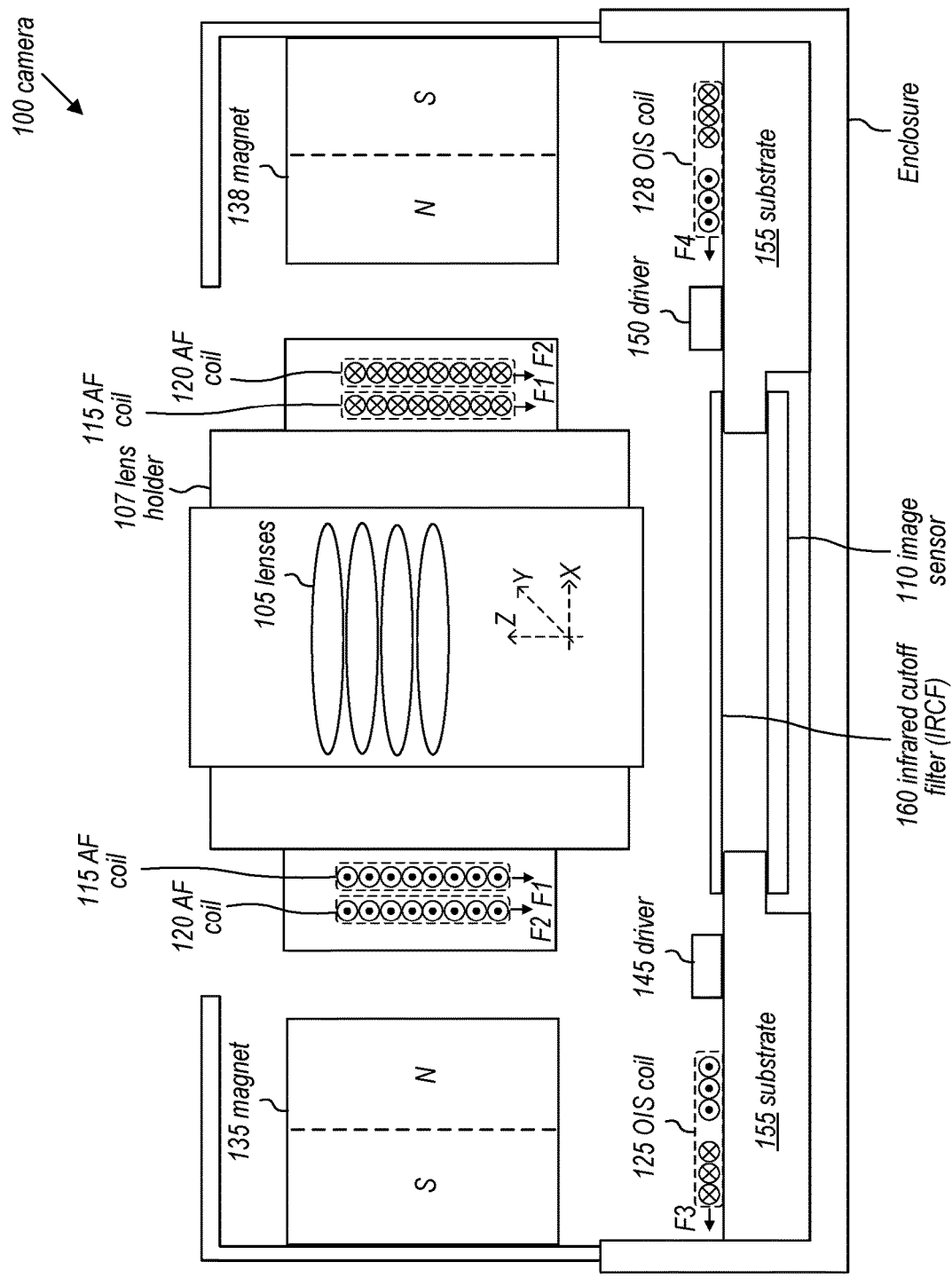
FIGS. 1A-1B show an example camera with an actuator driver system, according to some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . ." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112(f) for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

It will also be understood that, although the terms first, second, etc. may be used herein to describe various elements, these elements should not be limited by these terms. These terms are only used to distinguish one element from another. For example, a first contact could be termed a second contact, and, similarly, a second contact could be termed a first contact, without departing from the intended scope. The first contact and the second contact are both contacts, but they are not the same contact.

The terminology used in the description herein is for the purpose of describing particular embodiments only and is not intended to be limiting. As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

DETAILED DESCRIPTION

Various embodiments described herein relate to a camera having a scalable actuator driver system. In some embodiments, the camera may include one or more lenses, one image sensor, multiple coils of one or more actuators, and an actuator driver system. The lenses may pass through light from an external environment into the camera. The image sensor may generate image signals based on the light passing through the lenses. The image signals may be further processed by a processor to produce an image. The multiple coils may be able to electromagnetically interact with corresponding magnets to generate motive force (e.g., Lorentz force) to move the lenses and/or image sensor relative to one another in one or more directions. In some embodiments, the multiple coils may belong to one single actuator or multiple actuators respectively, where one or a few of the coils may operate to move one of the lenses or image sensor in a specific direction. The disclosed camera may be integrated as part of a mobile multipurpose device, such as a smartphone, a tablet, a pad device, and the like.

The actuator driver system may provide needed current for individual ones of the coils. The actuator driver system may include multiple drivers which may collaborate altogether and each drive corresponding one or more sets of coils to implement corresponding movement. Consider an actuator driver system including two drivers as an example. The two drivers may be two separate components each including an integrated circuit (IC) to function as a controller to control or regulate current of respective coil(s) of an actuator. Each driver may include its own sensor input pin or pins, coil output pin or pins, and processing core. Each driver may electrically connect with a power source (e.g., a battery) and generate regulated current for its connected actuator coil or coils.

In some embodiments, control functionality of the actuator(s) of the camera may be implemented using the two drivers together with a host (e.g., a separate controller). In some embodiments, the two drivers may communicate and collaborate with each other, where one may function as a "primary" driver whilst the other may serve as a "secondary" driver. Except initialization, only the primary driver may need to communicate with the host. In some embodiments, the host may reside within the camera or outside the camera but inside the multipurpose mobile device. This way, the two-driver combo may interface the host in an atomic way "looking" like a single driver. The primary driver may receive one or more signals from the host which may indicate one or more commands for a variety of different movement. For instance, in some embodiments, the signals received at the primary driver from the host may include one or more signals indicative of a command position for the lenses or the image sensor (depending on which one of the two components is to be moved) relative to one another along an optical axis of the lenses (or Z-axis) for performing AF. In some embodiments, the signals may include one or more signals indicative of a command position for the image sensor or the lenses along one or more axes (e.g., X- and/or Y-axis) orthogonal to the optical axis of the lenses (or Z-axis) for performing OIS. In some embodiments, the signals may include one or more signals indicative a command angle for the lenses relative to the image sensor around one or more axes (e.g., X- and/or Y-axis) orthogonal to the optical axis of the lenses (or Z-axis) for performing tilt.

In some embodiments, the primary driver may also receive one or more signals indicative of measurements from one or more sensors, e.g., position sensors. Based on the command signals from the host, together with the measurements from the sensors, the primary driver may execute one or more control algorithms to determine command current for the coils of the actuator or actuators, according to some embodiments. In addition, according to the connection of the coils with the two drivers, the primary driver may distribute signals indicative of the command current between the primary driver and the secondary driver. For instance, in some embodiments, the primary driver may retain signals indicative of a first set of determined current for a first set of coils connected to the primary driver, and transmit signals to the secondary driver indicative of a second set of determined current for a second set of coils connected to the secondary driver. In some embodiments, the communication between the primary and secondary drivers may be implemented using a high-speed unidirectional or bidirectional communication link, e.g., a serial or parallel communication link using conductive wires, fiber optics, or wireless connection. Accordingly, the primary driver may generate the first set of determined current for the first set of coils, whilst the secondary driver may provide the second set of determined current to the second set of coils. The first and second sets of coils may operate together to move the lenses and/or the image sensor to the commanded position and/or angle.

In some embodiments, the secondary driver may also receive measurement signals from one or more sensors, and provide the measurements to the primary driver that may in turn calculate the command current and send the command current signals back to the secondary driver. In some embodiments, the primary driver may send some or all of the measurements (including those obtained from the secondary driver) to the host, and the host may determine the command current for the two drivers. The host may transmit the command signals first to the primary driver, and the primary driver may then distribute and send some of the command signals to the secondary driver.

The disclosed actuator driver system can provide several benefits. One, it enables the use of relatively simple and low-cost driver chips to implement complicated movement functions. For instance, several chips may be combined as a group to collectively drive multiple coils to perform complicated movement, even though each chip may have only a limited number of input/output (I/O) and/or processing power. With the inter-chip communication, the combined computing resources of the two drivers may seamlessly access sensor data and actuators/coils. This is especially useful when it is desired to use legacy components and hardware (with minimum upgrade) for new products. Two, the actuator driver system provides great scalability to fit designs of different complexity. For instance, the above described primary-secondary configuration can be conveniently expanded to more than two drivers, where the drivers may be connected in a daisy chain or star topology. One driver may be delegated as the primary driver, whilst the other drivers may individually act as a secondary driver for the primary driver or another secondary driver. Again, the multiple drivers altogether can drive multiple coils of a camera to implement various movement functions.

Figure 1B:
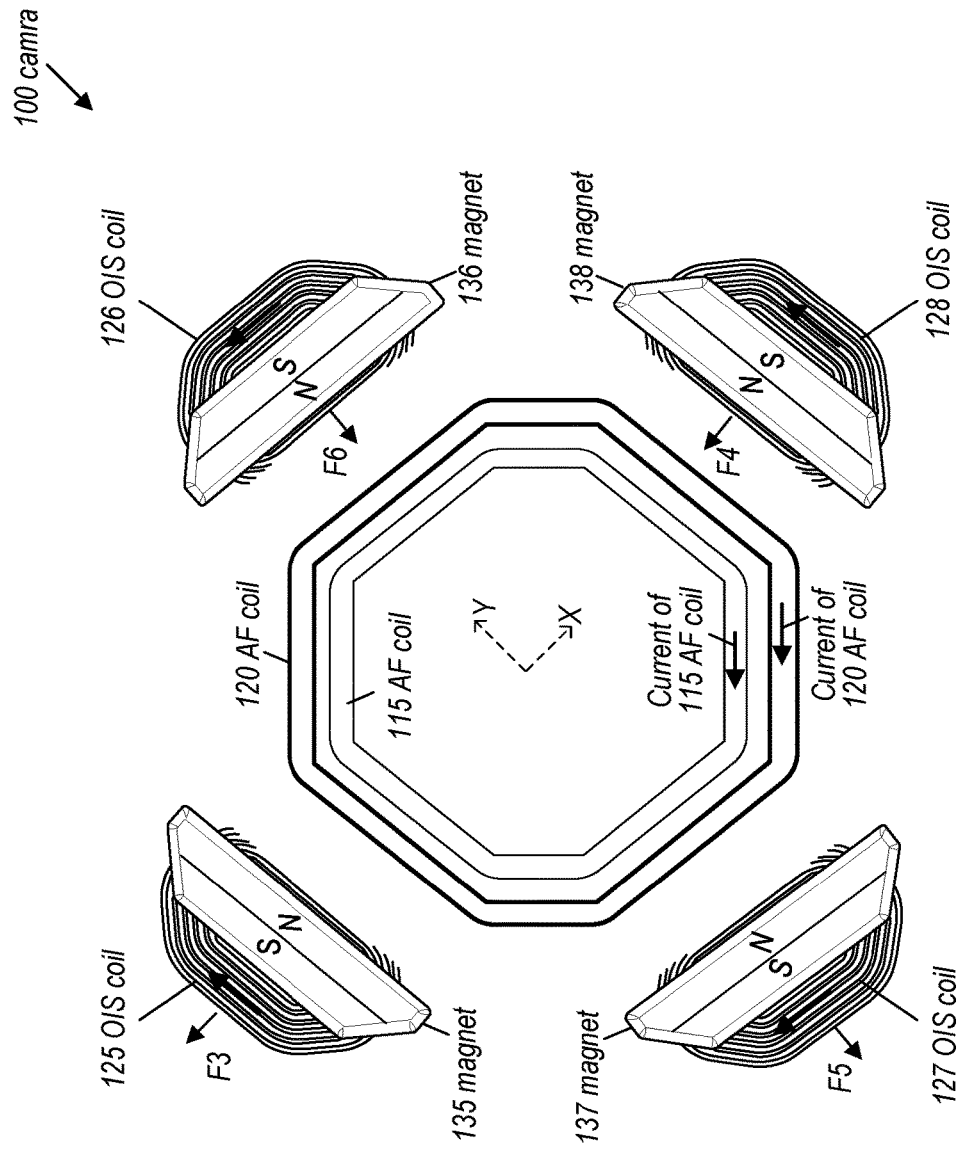

FIGS. 1A-1B show an example camera with an actuator driver system, according to some embodiments. FIG. 1A shows a cross-sectional view of the example camera, and FIG. 1B shows the corresponding top view. For purposes of illustration, only relevant components are shown in the figures. As shown in FIG. 1A, in this example, camera 100 may include one or more lenses 105 and image sensor 110, according to some embodiments. For purposes of illustration, a coordination system defined by X-Y-Z axes is also depicted, whereby an optical axis of lenses 105 is defined as Z-axis. In some embodiments, the optical axis may correspond to the transmission path of a principal light ray passing through lenses 105 to image sensor 110. In some embodiments, the transmission path of the principal light ray within camera 100 may not necessarily be a straight but rather a folded line, e.g., when camera 100 includes a light folding element as part of the one or more lenses that may change the transmission direction of the principal light ray. In that case, the optical axis may refer to any straight part of the folded line. As indicated in FIG. 1A, lenses 105 may pass through light from environment on to image sensor 110 of camera 100. Image sensor 110 may generate image signals, e.g., electrical signals, based on the light from lenses 105. The image signals may be further processed by a processor to produce an image. In some embodiments, lenses 105 may be contained in lens holder 107, and image sensor 110 may be mounted on substrate 155. In some embodiments, substrate 155 may include an organic substrate, a ceramic substrate, or a combination of organic and ceramic portions. For instance, substrate 155 may include a ceramic portion upon which image sensor 110 may be mounted, as well as an organic portion (e.g., a printed circuit board or PCB) that may be attached with the ceramic portion and used to hold other components and/or electrical traces for routing power and/or signals. In some embodiments, camera 100 may include infrared cutoff filter (IRCF) 160 that may be placed optically between lenses 105 and image sensor 110 to reduce or block infrared light from reaching image sensor 110.

In some embodiments, camera 100 may include AF coils 115 and 120, and/or OIS coils 125, 126, 127 and 128, as indicated in FIGS. 1A-1B. AF coils 115-120 may be fixedly coupled with lenses 105 (e.g., indirectly through lens holder 107), whilst OIS coils 125-128 may be attached with substrate 155 and thus (indirectly) fixedly coupled with image sensor 110. In some embodiments, camera 100 may include one or more suspension structures (not shown) between lens holder 107 and enclosure of camera 100, as well as between image sensor 110 and substrate 155. For instance, camera 100 may include one or more top and/or bottom springs connecting lens holder 107 with one or more stationary components (not shown) that are further attached to the enclosure of camera 100. In addition, camera 100 may include one or more flexures connecting a portion of substrate 155 where image sensor 110 is mounted (e.g., a ceramic portion of substrate 155) with the remaining portion of substrate 155 (e.g., an organic portion of substrate 155 attached with the ceramic portion) that is further attached to the enclosure of camera 100. The suspension structures may provide necessary mechanical support for lenses 105 and image sensor 110, but also elasticity that renders degrees of movement freedom. For instance, in some embodiments, lens 105 may be movable (together with AF coils 115-120) relative to image sensor 110 along the optical axis of lenses 105 (or Z-axis) to adjust the focal distance between lenses 105 and image sensor 110 to perform AF. In some embodiments, image sensor 110 (together with OIS coils 125-128) may be movable relative to lenses 105 along one or more axes (e.g., X- and/or Y-axis) orthogonal to the optical axis of lenses 105 (or Z-axis) to perform OIS. Note that the above is merely exemplary for purposes of illustration. In some embodiments, one or more lenses of a camera may be rotatable to an angle relative to an image sensor around one or more axes (e.g., X- and/or Y-axis) orthogonal to the optical axis of the lenses (or Z-axis) to perform tilt (as described below). Alternatively, in some embodiments, the AF, OIS and/or tilt functions may be implemented by moving only one component (e.g., either the lenses or the image sensor) in multiple corresponding directions. For instance, as described in FIG. 3, in some embodiments, an image sensor of a camera may be moved in the X, Y, and Z-axis to implement both AF and OIS functions. Similarly, in some embodiments, the lenses of a camera may be movable in the X, Y, and Z-axis, as well rotatable around the X- and/or Y-axis, to perform AF, OIS, and tilt functions.

In some embodiments, AF coils 115-120 and OIS coils 125-128 may be implemented as part of one single actuator or multiple separate actuators. Regardless, AF coils 115-120 and OIS coils 125-128 may respectively conduct individual current that can interact with the magnetic fields of magnets 135, 136, 137 and 138 to generate motive force (e.g., Lorentz force) to move lenses 105 and/or image sensor 110 relative to one another. For instance, in some embodiments, magnets 135-138 may be arranged surrounding a perimeter of lenses 105, e.g., individually at the four corners of camera 100 as indicated in the top view in FIG. 1B. AF coils 115-120 may each include one or more turns of windings surrounding the perimeter of lenses 105 in a concentric manner, thus sharing the magnetic fields generated by magnets 135-158. In FIG. 1A, the symbol of a circle with crossing inside refers to the direction of current out of the paper, whilst the symbol of a circle with dot inside means the direction of current into the paper. As for magnets 135-138, the labels of "N" and "S" respectively represent the individual north and south poles of the magnets. Direction of the current flowing through AF coils 115-120 are also indicated in FIG. 1B. Thus, in this example, AF coils 115-120 may interact with magnets 135-138 electromagnetically to generate motive force (e.g., Lorentz force) F1 and F2 approximately in the negative direction of the optical axis of lenses 105 (or Z-axis) as indicated in FIG. 1A, or into the paper in FIG. 1B. Note that the values and/or polarities of the current in AF coils 115-120 may be regulated such that the value and/or direction of the motive force F1 and F2 may be controlled as well. As a result, the motive force F1 and F2 may move lenses 105 relative to image sensor 110, e.g., upward or downward approximately along the optical axis of lenses 105 (or Z-axis) in FIG. 1A to implement AF.

In this example, OIS coils 125-128 may not necessarily be wound in a concentric manner or share the magnetic field of a same magnet, but rather each be positioned proximate and interact primarily with one corresponding magnet 135-138. Given the directions of the current in OIS coils 125 and 128 in this example, the coils may interact with magnets 135 and 138 respectively to generate motive force (e.g., Lorentz force) F3 and F4 approximately in the negative direction of X-axis as indicated in FIGS. 1A-1B. Similarly, OIS coils 126 and 127 may interact with magnets 136 and 137 respectively to generate motive force (e.g., Lorentz force) F5 and F6 approximately in the negative direction of Y-axis as indicated in FIG. 1B. Moreover, the values and/or polarities of the current in OIS coils 125-128 may be controlled. Thus, OIS coils 125-128 may operate with magnets 135-138, in combination, to move image sensor 110 relative to lenses 105 along X- and/or Y-axis to perform OIS. Note that the above is only an example for purposes of illustration. In some embodiments, design of the AF coils, OIS coils and associated magnets may be different but still be able to perform the AF and/or OIS functions. For instance, in some embodiments, camera 100 may include less or more AF coils (rather than two coils) arranged in the concentric manner to still perform the AF function. Similarly, in some embodiments, camera 100 may have less or more OIS coils, e.g., only two OIS coils such as OIS coils 125 and 126 each used to implement the OIS function for one axis (e.g., X- and Y-axis respectively). Accordingly, in some embodiments, camera 100 may have less or more magnets. Moreover, as described below, in some embodiments, a camera may include one or more additional coils that may operate to generate motive force to rotate lenses to an angle relative to an image sensor around X- or Y-axis.

In some embodiments, camera 100 may include an actuator driver system that may include drivers 145 and 150 to drive AF coils 115-120 and OIS coils 125-128. In some embodiments, drivers 145 and 150 may be attached to substrate 155. Drivers 145 and 150 may be two separate components each including an integrated circuit (IC) with associated input/output (I/O) and processing core. Each driver 145 and 150 may electrically connect with a power source of camera 100 (e.g., a battery) and generate regulated current for the connected coils. In some embodiments, drivers 145 and 150 may operate collaboratively in a primary-secondary mode, where one driver (e.g., driver 145) may act as a primary driver whilst the other driver (e.g., driver 150) may function as a secondary driver. Drivers 145 and 150 may electrically connect with a controller (not shown) of camera 100 that may function as a host for drivers 145 and 150, e.g., using serial or parallel communication with conductive wires, fiber optics, or wireless connection. The host may initialize drivers 145 and 150, e.g., to reset program counter, configure registers, and/or load firmware. Once initialized, only driver 145 (e.g., the primary driver) may need to communicate with the host during operation. This way, drivers 145 and 150 collectively may appear as one single driver to interface with the host.

In some embodiments, driver 145 may receive one or more signals from the host which may indicate one or more command position(s) and/or angle(s) for a movable component to be controlled by AF coils 115-120 and/or OIS coils 125-128 of camera 100. For instance, in some embodiments, the signals received at driver 145 from the host may include a signal indicative of a command position for lenses 105 relative to image sensor 110 along an optical axis of lenses 105 (or Z-axis) with respect to AF. In some embodiments, the signals may include one or more signals indicative of a command position for image sensor 110 relative to lenses 105 along one or more axes (e.g., X- and/or Y-axis) orthogonal to the optical axis of lenses 105 (or Z-axis) for performing OIS. In some embodiments, the signals may include a signal indicative a command angle for lenses 105 relative to image sensor 110 around one or more axes (e.g., X- and/or Y-axis) orthogonal to the optical axis of lenses 105 (or Z-axis) to implement tilt. Note that in some embodiments, the command signals received at driver 145 from the host may include multiple signals for camera 100 to perform the AF, OIS and/or tilt around the same time.

In some embodiments, driver 145 may also receive one or more signals indicative of measurements from one or more sensors, e.g., position sensors. A position sensor may include a variety of different sensors that can be used to measure a relative position, speed, distance and/or proximity of one object to another object. For instance, a position may include a giant magnetoresistance (GMR) sensor, anisotropic magnetoresistance (AMR) sensor, tunnel magnetoresistance (TMR) sensor, Hall-effect sensor, eddy-current sensor, inductive sensor, capacitive displacement sensor, etc. Based on the command signals from the host, together with the measurements from the sensors, driver 145 may execute one or more control algorithms to determine command current for AF coils 115-120 and/or OIS coils 125-128, according to some embodiments. In addition, according to the connection of AF coils 115-120 and OIS coils 125-128 with drivers 145 and 150, driver 145 may retain signals indicative of a first set of determined current for a first set of AF coils 115-120 and OIS coils 125-128 that are connected to driver 145, and send signals to the secondary driver indicative of a second set of determined current for a second set of coils (or remaining coils) connected to driver 150 (e.g., the secondary driver) through a unidirectional or bidirectional communication link, e.g., a serial or parallel communication link using conductive wires, fiber optics, or wireless connection. Based on their respective command current signals, driver 145 may generate the first set of determined current for the first set of coils, whilst driver 150 may provide the second set of determined current to the second set of coils. The first and second sets of AF coils 115-120 and OIS coils 125-128 collectively may operate to move lenses 105 and/or image sensor 110 to implement the commanded AF, OIS and/or tilt functions, as described above.

Figure 2:
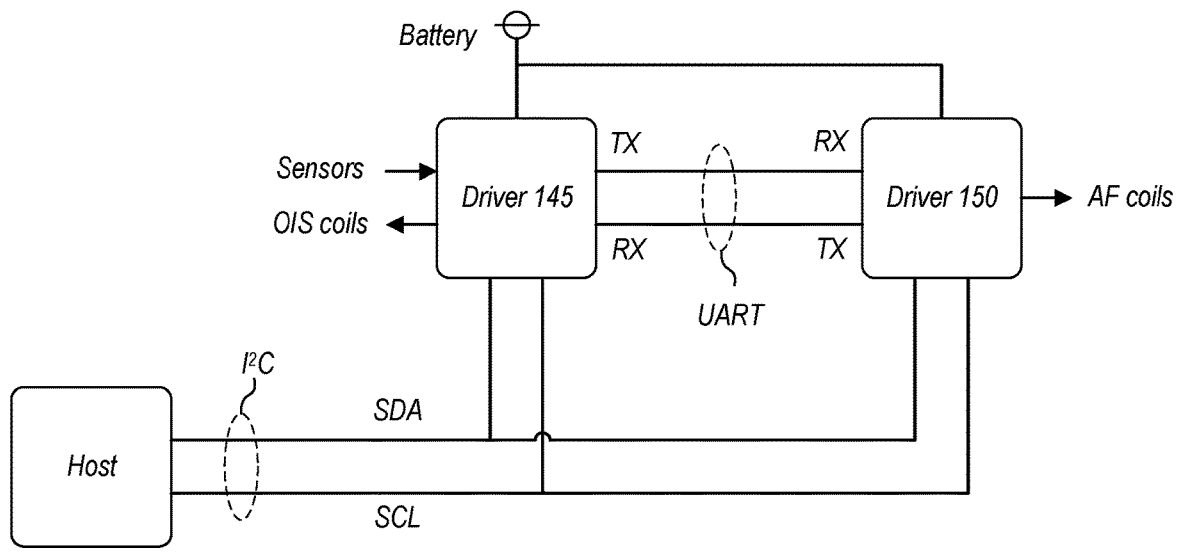
FIG. 2 shows an example actuator driver system of a camera, according to some embodiments.

FIG. 2 shows an example actuator driver system of a camera, according to some embodiments. In this example, drivers 145 and 150 may electrically connect with a host or controller of camera 100, e.g., using synchronous serial communication such as I2C. In addition, in some embodiments, driver 145 may communicate with driver 150, e.g., using asynchronous serial communication such as UART. Note that FIG. 2 is only an example for purposes of illustration. The communication between a driver and a host, and the inter-driver communication, may use a variety of different communication, such as asynchronous serial communication (e.g., UART, CAN, etc.), synchronous serial communication (e.g., I2C, SPI, etc.), or parallel communication (e.g., PCI, ISA, NuBus, PCMCIA, etc.) using conductive wires, fiber optics or wireless connection.

As described above, at start-up, the host may use the I2C communication link to reset and initialize drivers 145 and 150. Since then, during operation, only driver 145 (the primary driver) may need to communicate with the host, and thus the two-driver combo may appear as one single driver for the host. In some embodiments, during startup and/or operation, the host may also receive status signals from driver 145 and/or driver 150. During operation, driver 145 may receive one or more command signals from the host, e.g., via the I2C link, that may indicate a command position and/or an angle for a movable component, as described above. For instance, in some embodiments, the host may determine a position for lenses 105 relative to image sensor 110 along Z-axis based on analysis of image signals generated from image sensor 110, and send to driver 145 a signal indicative of the command position of lenses 105 to perform AF. In some embodiments, the host may determine one or more command positions for image sensor 110 relative to lenses 105 along X- and/or Y-axis based on data from a gyroscope, accelerometer and/or inertial measurement unit, and send to driver 145 one or more signals indicative of the command positions of image sensor 110 to perform OIS. In some embodiments, the host may determine a command angle for lenses 105 relative to image sensor 110 around X- or Y-axis based on analysis of the image signals from image sensor, and send to driver 145 a signal indicative of the command angle of lenses 105 to perform tilt. In some embodiments, the signals received at driver 145 from the host may include multiple command signals for performing the AF, OIS and/or tilt around the same time.

As indicated in FIG. 2, drivers 145 may also receive one or more signals indicative measurements from one or more sensors, such as GMR position sensors. In this example, driver 145 may receive the measurements from 5 sensors such as AF sensor, SZ1 sensor, SZ2 sensor, OIS1 sensor and OIS2 sensor installed at different locations inside camera 100. The AF sensor, SZ1 sensor, and SZ2 sensor collectively may provide measurements indicative of a position of lenses 105 relative to image sensor 110 along Z-axis. The OIS1 sensor and OIS2 sensor may provide measurements indicative of a position of image sensor 110 relative to lenses 105 along X-axis and Y-axis, respectively. Thus, in this example, all the sensor measurement signals may be provided to only driver 145 (e.g., the primary driver). In some embodiments, based on the command signals from the host and the measurements from the sensors, driver 145 may determine command current for AF coils 115-120 and/or OIS coils 125-128. In this example, OIS coils 125-128 may be assigned and connected to driver 145, whilst AF coils 115-120 may electrically connect to driver 150. Thus, driver 145 may keep for itself a first set of one or more signals indicative of the command current for OIS coils 125-128, and send to driver 150 a second set of one or more signals indicative of the command current for AF coils 115-120 via the UART link. In some embodiments, during operation, driver 145 may also obtain status signals from driver 150.

As shown in FIG. 2, drivers 145 and 150 may individually connect to a power source of camera 100 (e.g., a battery). Based on the command current signals, drivers 145 and 150 may use the battery as "input" and respectively generate regulated current for OIS coils 125-128 and AF coils 115-120 as "output". For instance, one terminal of OIS coil 125 may electrically connect to an output pin of driver 145, and the other terminal of OIS coil 125 may electrically connect to a common bus such as the ground to form a current flow channel. Note that in some embodiments, either drivers 145 or 150 may operate in a PWM or linear mode to produce current from the battery, and the operating mode of the drivers may be set using the PWM/Linear mode input pin. Further, in some embodiments, the actuator driver system may include one or more temperature sensors, such as a negative temperature coefficient (NTC) thermistor, that may be connected to driver 145. In some embodiments, driver 145 may use the temperature measurement to adjust the determined command current for AF coils 115-120 and/or OIS coils 125-128, e.g., using a predetermined lookup table. Note that in some embodiments, the number of coils and/or sensors of camera 100 may vary. Accordingly, distribution of the coils and/or sensors between drivers 145 and 150 may be adjusted as well. Further, when needed, the actuator drier system of camera 100 is scalable and may be expanded to have more than two drivers to meet I/O requirement. In addition, in some embodiments, the communication between the host and driver 145 may be at a lower rate than that between driver 145 and 150 during operation. In other words, update of the command signals from the host to driver 145 may be implemented at a lower frequency than that from driver 145 to driver 150.

Figure 3:
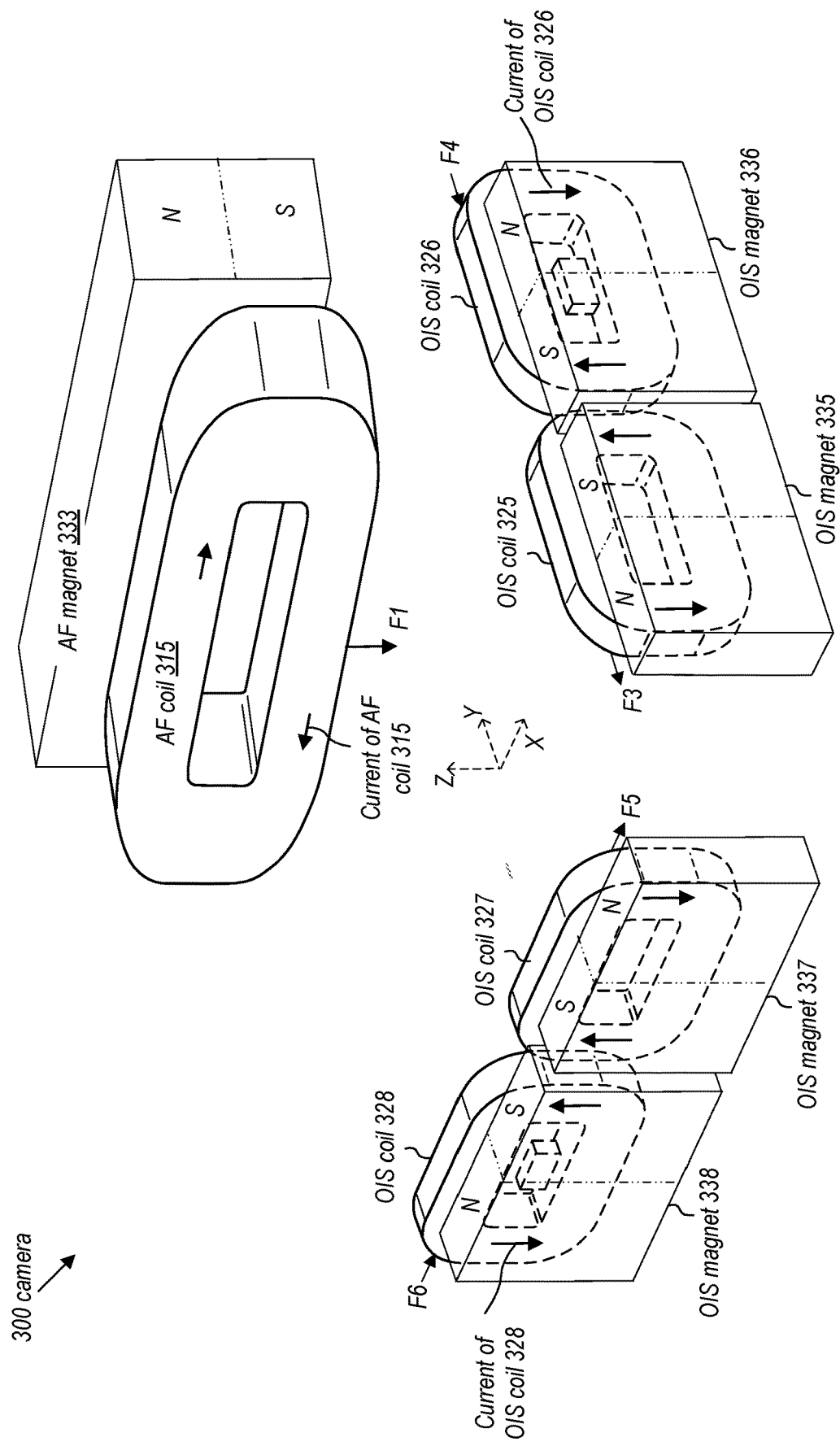
FIG. 3 shows another example camera with an actuator driver system, according to some embodiments.

FIG. 3 shows another example camera with an actuator driver system, according to some embodiments. For purposes of illustration, only relative components are illustrated in the figure to show the camera's operating principle. In this example, camera 300 may include AF coil 315, and/or OIS coils 325, 326, 327 and 328, all fixedly coupled with an image sensor of camera 300 (not shown). For instance, AF coil 315 and OIS coils 325-328 may be affixed with a substrate upon which the image sensor may be mounted. As a result, AF coil 315 and OIS coils 325-328 may move together with the image sensor relative to one or more lenses of camera 300. Unlike camera 100, AF coil 315 of camera 300 may not necessarily surround a perimeter (e.g., of the lenses), but instead may be arranged in a plane (e.g., X-Z plane) parallel to an optical axis or the lenses (or Z-axis) of camera 300, as indicated in FIG. 3. Thus, AF coil 315 may conduct controllable current that interacts primarily with stationary magnet 333 to generate motive force (e.g., Lorentz force) F1 that can move the image sensor relative to the lenses of camera 300 approximately along Z-axis to perform AF. In addition, camera 300 may include magnets 335, 336, 337 and 338 each proximate one corresponding OIS coil 325, 326, 327 and 328. Similar to AF coils 315, in some embodiments, OIS coils 325-328 may be also wound in a plane (e.g., X-Z and Y-Z planes) parallel to the optical axis (or Z-axis). Thus, similarly each OIS coil 325-328 may conduct regulated current interacting primarily with one corresponding magnet 335-338 to respectively generate motive force (e.g., Lorentz force) F2, F3, F4 and F5 that can move the lenses relative to the image sensor approximately along X- and/or Y-axis to implement OIS. In other words, unlike camera 100, camera 300 may move only the image sensor (relative to the lenses) in multiple directions to implement both AF and OIS functions. Moreover, in some embodiments, AF coil 315 and/or OIS coils 325-328 may exchange their spatial positions with corresponding AF magnet 333 and/or OIS magnets 335-338, such that magnets 333 and/or 325-338 may be fixedly coupled with movable image sensor whilst coils 315 and/or 325-328 may become stationarily coupled with a stationary portion of camera 300. Note that the embodiment in FIG. 3 is presented only as an example for purposes of illustration and is not intended to limit the implementation or application of the disclosed techniques. In some embodiments, the lenses, not the image sensor, may the movable component for performing the AF and/or OIS functions. For instance, AF coil 315 and/or OIS coils 325-328 may be fixedly coupled with the lenses (e.g., indirectly through a lens holder) to move the lenses in multiple directions to implement the AF and/or OIS functions.

Figure 4:
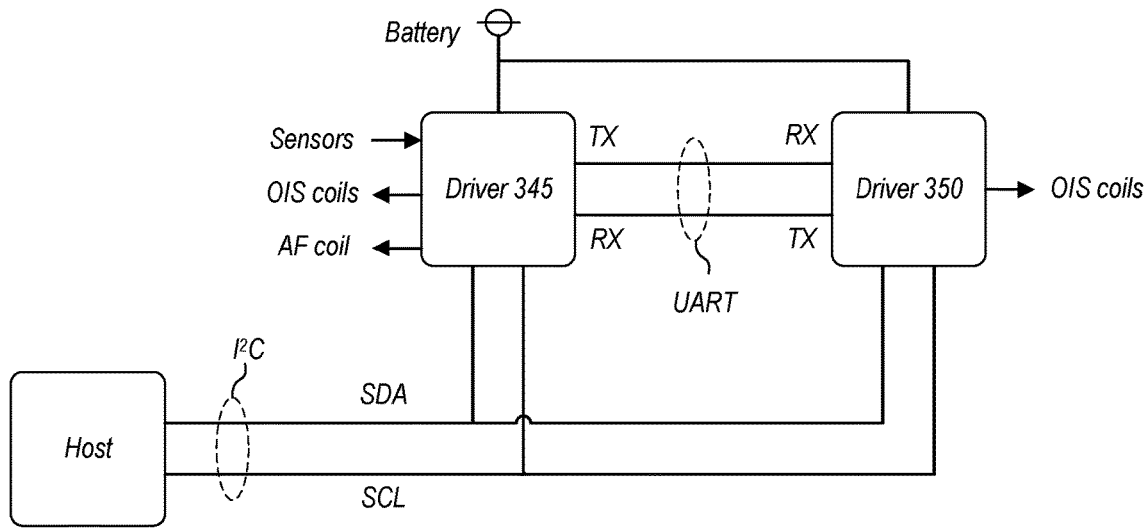
FIG. 4 shows another example actuator driver system of a camera, according to some embodiments.

FIG. 4 shows an example actuator driver system for camera 300, according to some embodiments. As indicated in FIG. 4, the actuator driver system of camera 300 may include at least two drivers 345 and 350, where driver 345 may act as a primary driver and driver 350 as a secondary driver. The drivers may communicate with a host and with each other, at initialization and normal operation, in substantially similar ways as described above in FIG. 2. However, unlike camera 100, in camera 300, distribution of sensors and coils between drivers 345 and 350 may be different. For instance, as indicated in FIG. 4, in this example, camera 300 may use one sensor (e.g., AF sensor) to measure the relative position between the lenses and image sensor along Z-axis, and two sensors (e.g., OIS1 sensor and OIS2 sensor) to determine relative positions between the lenses and image sensor along X- and Y-axis respectively. For purposes of illustration, consider that drivers 345 and 350 individually have only five output pins. Thus, in this example, OIS coils 325-326 (for OIS in X-axis) and AF coil 315 may be distributed to driver 145, and the remaining OIS coils 327-328 (for OIS in Y-axis) may be assigned to driver 150. Further, in this example, all sensor measurement signals may be provided to driver 345 (e.g., the primary driver). In turn, driver 345 may determine command current for AF coils 315 and/or OIS coils 325-328, based on command signals received from the host and the sensor measurement signals. Accordingly, driver 345 may retain the signals indicative of the determined current for OIS coils 325-326 and AF coil 315 at driver 145, and send the signals indicative of the determined current for OIS coils 327-328 to driver 150. According to the command current signals, drivers 345 and 350 may respectively generate the determined current for OIS coils 325-326 and AF coil 315, and OIS coils 327-328.

Figure 5:
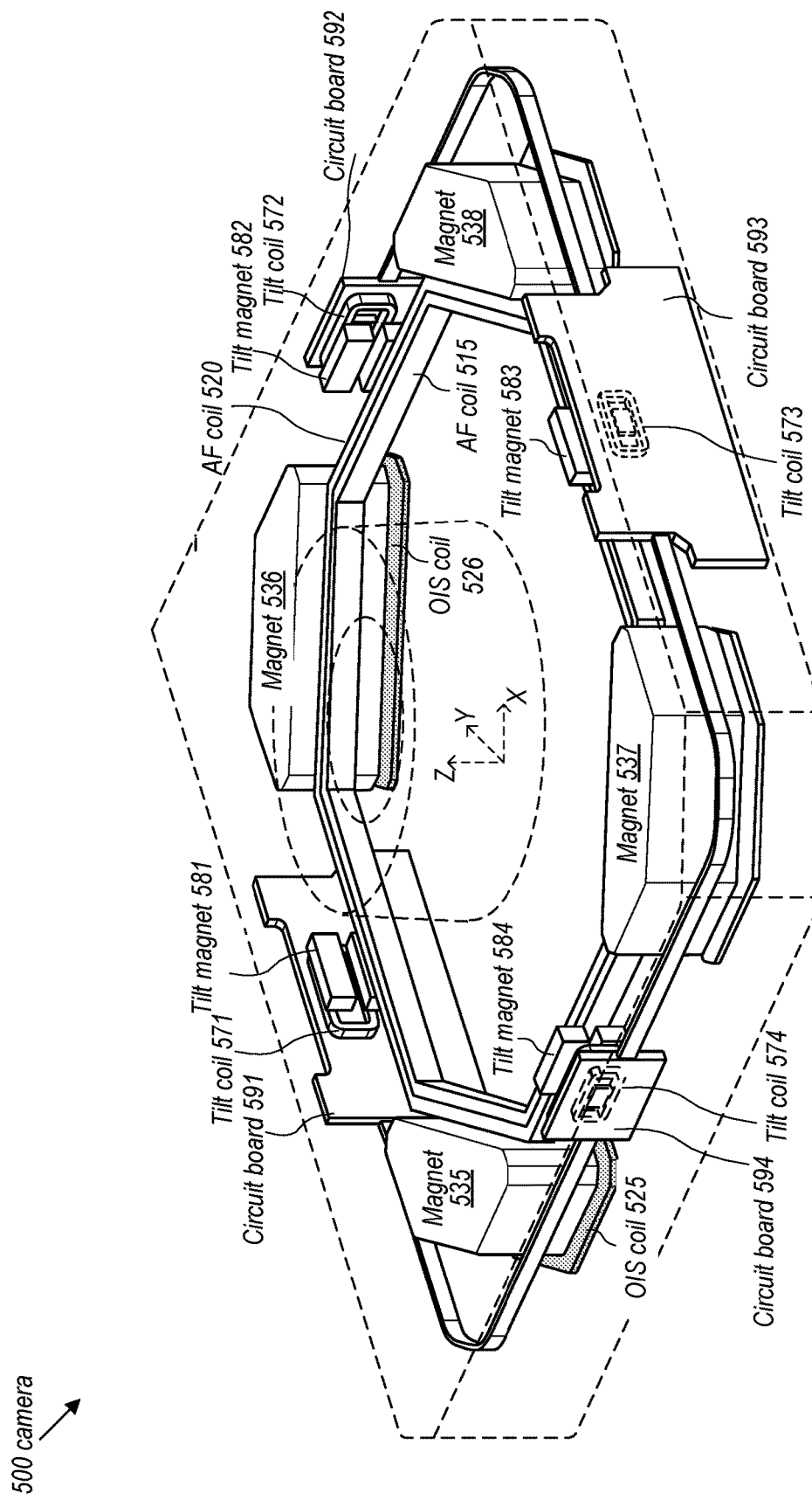
FIG. 5 shows another example camera with an actuator driver system, according to some embodiments.

FIG. 5 shows another example camera with an actuator driver system, according to some embodiments. For purposes of illustration, only relative components are illustrated in the figure. In this example, camera 500 may include AF coils 515 and 520, OIS coils 525 and 526, and magnets 535, 536, 537 and 538. Similar to camera 100, AF coils 515-520 and/or OIS coils 525-526 may electromagnetically interact with magnets 535-538 to generate motive force (e.g., Lorentz force) to move one or more lenses relative to an image sensor of camera 500 along Z-axis to implement AF, and/or the image sensor relative to the lenses of camera 500 along X- and/or Y-axis to implement OIS. However, different from cameras 100 and 300, camera 500 may further include additional tilt coils 571, 572, 573 and 574 and corresponding tilt magnets 581/582/583/584. In some embodiments, tilt coils 571-574 may be fixedly coupled with stationary circuit boards 591, 592, 593 and 594, whilst tilt magnets 581-584 may be fixedly coupled with the movable lenses of camera 500. As indicated in FIG. 5, in this example, tilt coils 571-574 and tilt magnets 581-584 may be placed around a perimeter of the lenses of camera 500, where each tilt coil may interact primarily with one proximate tilt magnet. For instance, tilt coils 571 and 573 may respectively interact with tilt magnets 581 and 583 to generate motive force (e.g., Lorentz force) to rotate the lenses around Y-axis, whilst tilt coils 572 and 574 may respectively interact with tilt magnets 582 and 584 to generate motive force (e.g., Lorentz force) to rotate the lenses around X-axis. Thus, tilt coils 571-574 and tilt magnets 581-584 may operate to perform the tilt function for camera 500.

FIG. 6 shows an example actuator driver system for camera 500, according to some embodiments. As indicated in FIG. 6, the actuator driver system of camera 500 may include at least two drivers 545 and 550. The drivers may communicate with a host and with each other, at initialization and normal operation, in substantially similar ways as described above in FIGS. 2 and 4. However, distribution of sensors and coils between drivers 545 and 550 of camera 500 may be different from the distribution in cameras 100 and 300. In particular, in this example, camera 500 may include more sensors to provide measurement signals and coils to be controlled. For purposes of illustration, consider that drivers 545 and 550 individually have only five output pins, but also only 10 input pints. Accordingly, both drivers 545 and 550 may need to be used to obtain the measurement signals from the sensors. For instance, the measurement signals from five sensors (e.g., OIS1 sensor, OIS2 sensor, SZ1 sensor, SZ1 sensor, and AF TX1 sensor) may be provided to driver 545, whilst the remaining sensor (e.g., AF TY1 sensor, AF TY2 sensor, and AF TX2 sensor) signals may be provided to driver 550. In this example, OIS1 sensor and OIS2 sensor may be used to respectively measure the relative position of the image sensor from the lenses along X-axis and Y-axis for OIS function, SZ1 sensor, SZ2 sensor and AF TX1 sensor may collectively identify the relative position of the lenses from the image sensor for AF function, AFTX1 sensor and AF TX2 sensor may provide measurements of the angle of the lenses relative to the image sensor around X-axis for performing tilt around X-axis, and AF TY1 sensor and AF TY2 sensor may measure the angle of the lenses around Y-axis for implementing tilt around Y-axis. Given the limited number of output pins for the drivers, OIS coils 525 and 526, and tilt coils 571 and 572 (for tilt around Y-axis) may be assigned to the output pins of driver 545, whilst AF coils 515 and 520, and tilt coils 572/574 (for tilt around X-axis) may be distributed to driver 550.

During operation, driver 550 may provide the measurement signals from its connected sensors (e.g., AF TY1 sensor, AF TY2 sensor, and AF TX2 sensor) to driver 545, e.g., via the UART link. In other words, drivers 545 and 550 may share the measurements from the various sensors. In some embodiments, driver 550 may first pre-process its received measurement signals, and then send the pre-processed measurement signals to driver 545. In some embodiment, upon receipt of the pre-processed measurements from driver 550, driver 545 may perform one or more additional post-processing on the measurements. Further, driver 545 may receive one or more command signals from the host. Combining the sensor measurement signals from driver 550 (e.g., the pre-processed signals from driver 545) as well as those received by itself, together with the command signals from the host, driver 545 may determine the command current for OIS coils 525-526, AF coils 515-520, and tilt coils 571-574. Accordingly, driver 545 may retain a first set of signals indicative of the determined current for OIS coils 525-526, and tilt coils 571 and 572 at driver 545, and send to driver 550 a second set of signals indicative of the determined current for AF coils 515-520, and tilt coils 572 and 574, to generate the determined current for the individual coils.

Alternatively, in some embodiments, determination of the coil current may be performed at both driver 545 and the host. For instance, driver 545 may provide sensor measurement signals associated with the tilt function to the host, and let the host determine the command current for tilt coils 571-574. In addition, driver 545 may perform the calculation locally to determine the command current for only OIS coils 525-526 and AF coils 515-520. The host may return the command current for tilt coils 571-574 to driver 545 first, and driver 545 may then send signals indicative of the command current for tilt coils 572 and 574 to driver 550. As described above, the communication between the host and driver 545 may have a lower rate than that between drivers 454 and 550. However, the separation of the tilt control from AF and OIS functions is still feasible because the tilt control loop may require only a lower bandwidth compared to the AF and OIS functions, according to some embodiments. Note that such separation of the control functions may be implemented in a variety of different ways. For instance, in some embodiments, not only the tilt but also the OIS function may be delegated to the host.

Note that FIGS. 5-6 are provided only as an example for purposes of illustration. In some embodiments, not only sensor data, but also command signals from a host may be shared from one driver (e.g., driver 545) to another (e.g., driver 550). In addition, given the sharing of the information between drivers 545 and 550, each of the drivers by itself may use the information to determine the command current for its corresponding coils. For example, as described above, the lenses of camera 500 may be tiled around two separate axes by controlling the respective pairs of tilt coils 571 and 573, and 572 and 574. In some embodiments, tilting the lenses around one axis (e.g., by controlling tilt coils 571 and 573) may affect tilting the lenses around the other axis (e.g., by controlling tilt coils 572 and 574). Thus, drivers 545 and 550 may need to share information between them in order to coordinate the control of tilting of the lenses. For example, given the sensor measurements (including sensor measurements sent from driver 550) and command signals from the host, driver 545 may determine the command current for tilt coils 571 and 573. Similarly, given the sensor measurements (including sensor measurements sent from driver 545) and command signals from the host (received through driver 545), driver 550 may determine the command current for tilt coils 572 and 574. With the determined command current, the two drivers may be able to control the corresponding tilt coils to tilt the lenses to the required position.

Figure 7:
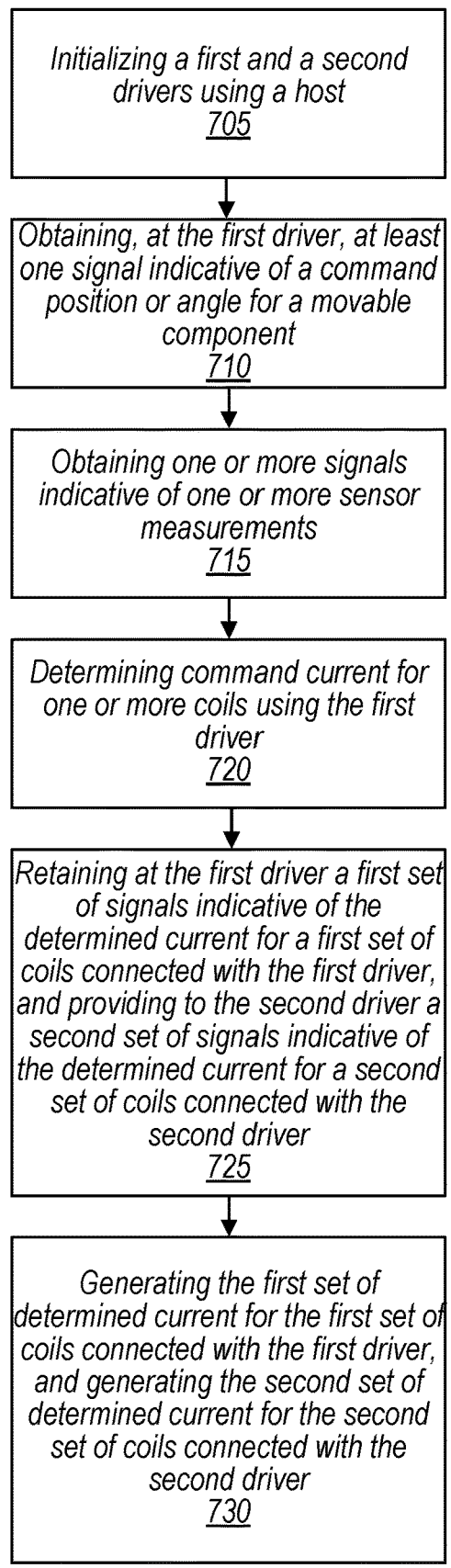
FIG. 7 shows an example method for using an actuator driver system to drive multiple coils of a camera, according to some embodiments.

FIG. 7 is a high-level flowchart showing an example method for using an actuator driver system to drive multiple coils of a camera, according to some embodiments. In this example, a first driver and a second driver (like the two-drive combo described above) of the actuator driver system may be initialized using a host or controller of a camera, as indicated in block 705. At initialization, the first driver may be configured as a primary driver, whilst the second driver may be delegated as a secondary driver. Once initialized, the first driver may obtain at least one signal indicative of a command position and/or angle for a movable component (e.g., one or more lenses, or an image sensor) of the camera, as indicated in block 710. As described above, the signal received at the first driver from the host may represent a command position for the movable component along Z-axis with respect to AF, a command position along X-axis and/or Y-axis regarding OIS, and/or a command angle around X-axis and/or Y-axis to implement tilt. Moreover, in some embodiments, the first driver may receive multiple command signals for performing AF, OIS and/or tilt functions around the same time.

In some embodiments, the first driver may also obtain one or more signals indicative of measurements from one or more sensors, as indicated in block 715. As described above, the sensor measurement signals may be used to identify a relative position and/or angle of the movable component. In addition, in some embodiments, when the first driver uses up its input pins, the sensor measurement signals may be also provided to the second driver.

In some embodiments, the first driver may execute one or more control algorithms and determine command current for one or more coils connected to the first driver and second driver, according to the command signal from the host and the sensor measurement signals, as indicated in block 720. As described above, in some embodiments, some of the sensor measurement signals may be sent from the second driver to the first driver. In addition, in some embodiments, some of the control functions may be performed at different components, such as at the host and the first driver. For instance, in some embodiments, the first driver may send the sensor measurement signals associated with the tilt function to the host and, in response, the host may determine and return to the first driver the command current for the tilt coils.

In some embodiments, the first driver may distribute signals indicative of the command current for the coils between the first and second drivers, according to the connection of the coils with the two drivers respectively, as indicated in block 725. For instance, the first driver may keep for itself a first set of signals indicative of the determined current for a first set of coils connected to the first driver and send to the second driver a second set of signals indicative of the determined current for a second set of coils connected to the second driver. In some embodiments, responsive to the command current signals, the first and second drivers may respectively generate and provide the determined current for the connected coils to perform the commanded AF, OIS and/or tilt function, as indicated in block 730.

Figure 8:
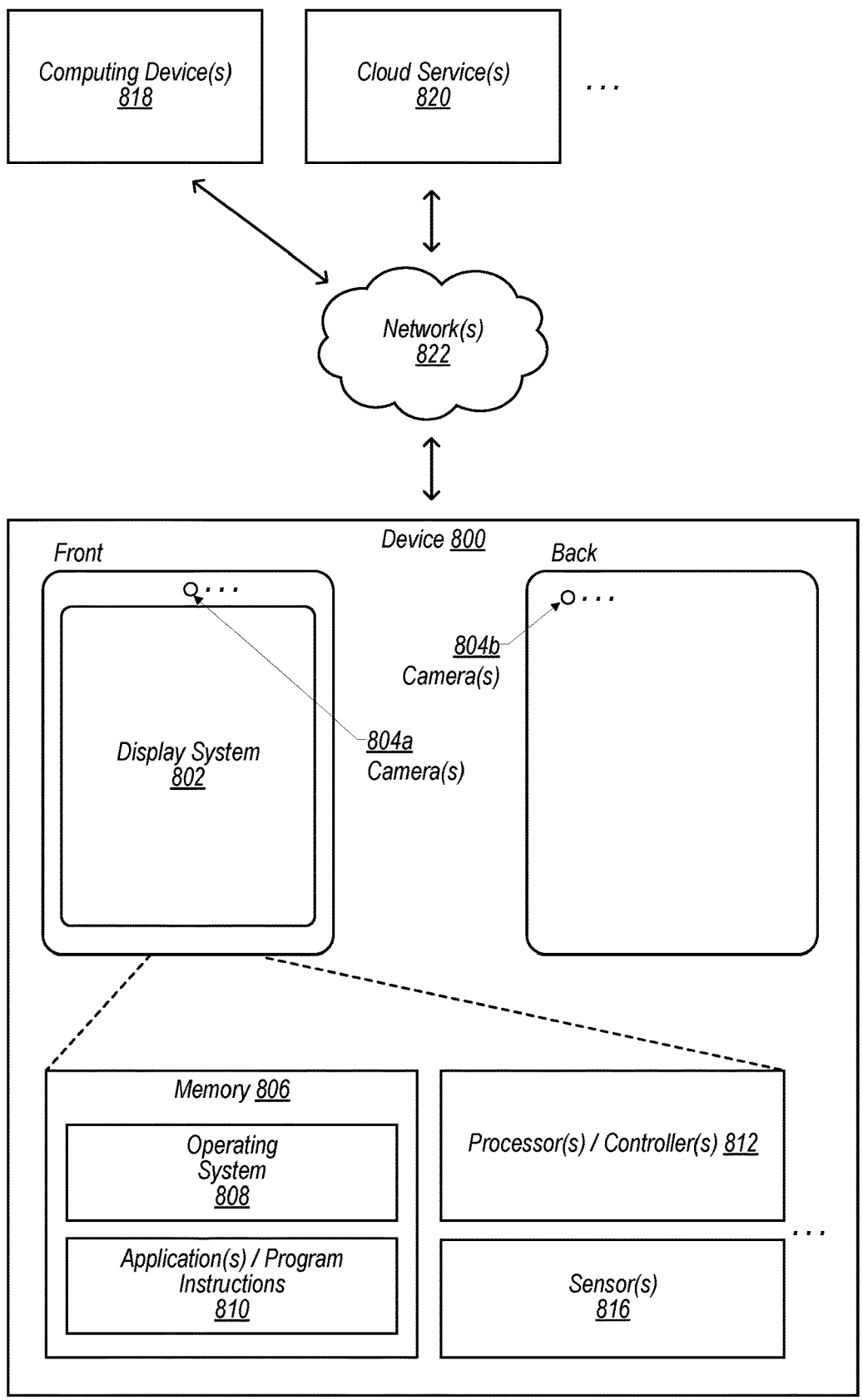
FIG. 8 shows a schematic representation of an example device that may include a camera having an actuator driver system, according to some embodiments.

FIG. 8 illustrates a schematic representation of an example device 800 that may include a camera (like the camera described above) having an actuator driver system, e.g., as described herein with reference to FIGS. 1-7, according to some embodiments. In some embodiments, the device 800 may be a mobile device and/or a multifunction device. In various embodiments, the device 800 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, an augmented reality (AR) and/or virtual reality (VR) headset, a consumer device, video game console, handheld video game device, application server, storage device, a television, a video recording device, a peripheral device such as a switch, modem, router, or in general any type of computing or electronic device.

In some embodiments, the device 800 may include a display system 802 (e.g., comprising a display and/or a touch-sensitive surface) and/or one or more cameras 804. In some non-limiting embodiments, the display system 802 and/or one or more front-facing cameras 804a may be provided at a front side of the device 800, e.g., as indicated in FIG. 8. Additionally, or alternatively, one or more rear-facing cameras 804b may be provided at a rear side of the device 800. In some embodiments comprising multiple cameras 804, some or all of the cameras may be the same as, or similar to, each other. Additionally, or alternatively, some or all of the cameras may be different from each other. In various embodiments, the location(s) and/or arrangement(s) of the camera(s) 804 may be different than those indicated in FIG. 8.

Among other things, the device 800 may include memory 806 (e.g., comprising an operating system 808 and/or application(s)/program instructions 810), one or more processors and/or controllers 812 (e.g., comprising CPU(s), memory controller(s), display controller(s), and/or camera controller(s), etc.), and/or one or more sensors 816 (e.g., orientation sensor(s), proximity sensor(s), and/or position sensor(s), etc.). In some embodiments, the device 800 may communicate with one or more other devices and/or services, such as computing device(s) 818, cloud service(s) 820, etc., via one or more networks 822. For example, the device 800 may include a network interface (e.g., network interface 910) that enables the device 800 to transmit data to, and receive data from, the network(s) 822. Additionally, or alternatively, the device 800 may be capable of communicating with other devices via wireless communication using any of a variety of communications standards, protocols, and/or technologies.

Figure 9:
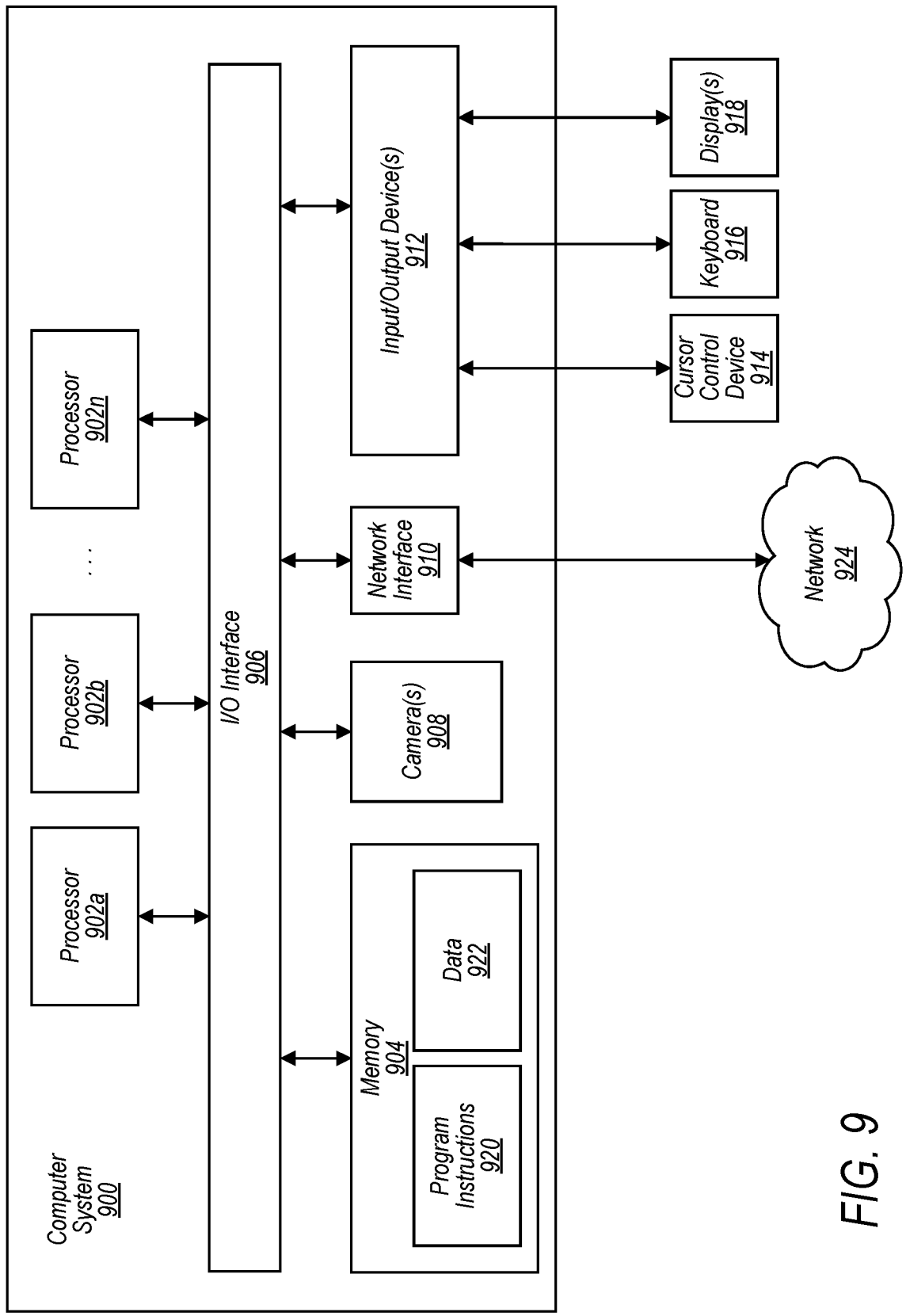
FIG. 9 shows a schematic block diagram of an example computer system that may include a camera having an actuator driver system, according to some embodiments.

FIG. 9 illustrates a schematic block diagram of an example computing device, referred to as computer system 900, that may include or host embodiments of a camera having an actuator driver system, e.g., as described herein with reference to FIGS. 1-8, according to some embodiments. In addition, computer system 900 may implement methods for controlling operations of the camera and/or for performing image processing images captured with the camera. In some embodiments, the device 800 (described herein with reference to FIG. 8) may additionally, or alternatively, include some or all of the functional components of the computer system 900 described herein.

The computer system 900 may be configured to execute any or all of the embodiments described above. In different embodiments, computer system 900 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, an augmented reality (AR) and/or virtual reality (VR) headset, a consumer device, video game console, handheld video game device, application server, storage device, a television, a video recording device, a peripheral device such as a switch, modem, router, or in general any type of computing or electronic device.

In the illustrated embodiment, computer system 900 includes one or more processors 902 coupled to a system memory 904 via an input/output (I/O) interface 906. Computer system 900 further includes one or more cameras 908 coupled to the I/O interface 906. Computer system 900 further includes a network interface 910 coupled to I/O interface 906, and one or more input/output devices 912, such as cursor control device 914, keyboard 916, and display(s) 918. In some cases, it is contemplated that embodiments may be implemented using a single instance of computer system 900, while in other embodiments multiple such systems, or multiple nodes making up computer system 900, may be configured to host different portions or instances of embodiments. For example, in one embodiment some elements may be implemented via one or more nodes of computer system 900 that are distinct from those nodes implementing other elements.

In various embodiments, computer system 900 may be a uniprocessor system including one processor 902, or a multiprocessor system including several processors 902 (e.g., two, four, eight, or another suitable number). Processors 902 may be any suitable processor capable of executing instructions. For example, in various embodiments processors 902 may be general-purpose or embedded processors implementing any of a variety of instruction set architectures (ISAs), such as the x86, PowerPC, SPARC, or MIPS ISAs, or any other suitable ISA. Also, in some embodiments, one or more of processors 902 may include additional types of processors, such as graphics processing units (GPUs), application specific integrated circuits (ASICs), etc. In multiprocessor systems, each of processors 902 may commonly, but not necessarily, implement the same ISA. In some embodiments, computer system 900 may be implemented as a system on a chip (SoC). For example, in some embodiments, processors 902, memory 904, I/O interface 906 (e.g., a fabric), etc. may be implemented in a single SoC comprising multiple components integrated into a single chip. For example, an SoC may include multiple CPU cores, a multi-core GPU, a multi-core neural engine, cache, one or more memories, etc. integrated into a single chip. In some embodiments, an SoC embodiment may implement a reduced instruction set computing (RISC) architecture, or any other suitable architecture.

System memory 904 may be configured to store program instructions 920 accessible by processor 902. In various embodiments, system memory 904 may be implemented using any suitable memory technology, such as static random access memory (SRAM), synchronous dynamic RAM (SDRAM), nonvolatile/Flash-type memory, or any other type of memory. Additionally, existing camera control data 922 of memory 904 may include any of the information or data structures described above. In some embodiments, program instructions 920 and/or data 922 may be received, sent or stored upon different types of computer-accessible media or on similar media separate from system memory 904 or computer system 900. In various embodiments, some or all of the functionality described herein may be implemented via such a computer system 900.

In one embodiment, I/O interface 906 may be configured to coordinate I/O traffic between processor 902, system memory 904, and any peripheral devices in the device, including network interface 910 or other peripheral interfaces, such as input/output devices 912. In some embodiments, I/O interface 906 may perform any necessary protocol, timing or other data transformations to convert data signals from one component (e.g., system memory 904) into a format suitable for use by another component (e.g., processor 902). In some embodiments, I/O interface 906 may include support for devices attached through various types of peripheral buses, such as a variant of the Peripheral Component Interconnect (PCI) bus standard or the Universal Serial Bus (USB) standard, for example. In some embodiments, the function of I/O interface 906 may be split into two or more separate components, such as a north bridge and a south bridge, for example. Also, in some embodiments some or all of the functionality of I/O interface 906, such as an interface to system memory 904, may be incorporated directly into processor 902.

Network interface 910 may be configured to allow data to be exchanged between computer system 900 and other devices attached to a network 924 (e.g., carrier or agent devices) or between nodes of computer system 900. Network 924 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 910 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 912 may, in some embodiments, include one or more display terminals, keyboards, keypads, touchpads, scanning devices, voice or optical recognition devices, or any other devices suitable for entering or accessing data by one or more computer systems 900. Multiple input/output devices 912 may be present in computer system 900 or may be distributed on various nodes of computer system 900. In some embodiments, similar input/output devices may be separate from computer system 900 and may interact with one or more nodes of computer system 900 through a wired or wireless connection, such as over network interface 910.

Those skilled in the art will appreciate that computer system 900 is merely illustrative and is not intended to limit the scope of embodiments. In particular, the computer system and devices may include any combination of hardware or software that can perform the indicated functions, including computers, network devices, Internet appliances, PDAs, wireless phones, pagers, etc. Computer system 900 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 900 may be transmitted to computer system 900 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:

1. A device, comprising:
   at least one lens;
   an image sensor;
   a first component configured to:
     obtain at least one signal from a controller;
     obtain one or more signals indicative of one or more sensor measurements;
     determine, based on the at least one signal and the one or more signals indicative of the one or more sensor measurements, (1) a first set of current for a first set of coils of one or more actuators and (2) a second set of current for a second set of coils of the one or more actuators for interacting with one or more magnets to move at least one of (a) the at least one lens or (b) the image sensor; and
     provide the first set of determined current to the first set of coils of the one or more actuators; and
   a second component configured to:
     obtain, from the first component, at least one signal indicative of the second set of determined current for the second set of coils; and
     provide the second set of determined current to the second set of coils of the one or more actuators.

2. The device of claim 1,
   wherein the first set of current provided from the first component to the first set of coils includes current for at least a first coil to move the image sensor relative to the at least one lens along one or more axes orthogonal to an optical axis of the at least one lens, and
   wherein the second set of current provided from the second component to the second set of coils includes current for at least a second coil to move the at least one lens relative to the image sensor along the optical axis of the at least one lens.

3. The device of claim 1,
   wherein the first set of current provided from the first component to the first set of coils includes (1) current for at least a first coil to move the image sensor relative to the at least one lens along a first axis orthogonal to an optical axis of the at least one lens and (2) current for at least a second coil to move the image sensor relative to the at least one lens along the optical axis of the at least one lens, and
   wherein the second set of current provided from the second component to the second set of coils includes current for at least a third coil to move the image sensor relative to the at least one lens along a second axis orthogonal to the optical axis of the at least one lens.

4. The device of claim 1,
   wherein the first set of current provided from the first component to the first set of coils includes (1) current for at least a first coil to move the image sensor relative to the at least one lens along an axis orthogonal to an optical axis of the at least one lens and (2) current for at least a second coil to rotate the at least one lens relative to the image sensor around a first axis orthogonal to the optical axis of the at least one lens, and wherein the second set of current provided from the second component to the second set of coils includes (1) current for at least a third coil to move the at least one lens relative to the image sensor along the optical axis of the at least one lens and (2) current for at least a fourth coil to rotate the at least one lens relative to the image sensor around a second axis orthogonal to the optical axis of the at least one lens.

5. The device of claim 1, wherein the first component is further configured to:
provide, to the controller, at least one of the one or more signals indicative of the one or more sensor measurements;
obtain, from the controller, at least one signal indicative of a third set of determined current for a third set of coils and at least one signal indicative of a fourth set of determined current for a fourth set of coils of the one or more actuators; and
provide the third set of determined current to the third set of coils, and wherein the second component is further configured to:
obtain, from the first component, the at least one signal indicative of a fourth set of determined current for a fourth set of coils; and
provide the fourth set of determined current to the fourth set of coils, wherein the first set of current provided from the first component to the first set of coils includes current for at least a first coil to move the image sensor relative to the at least one lens along an axis orthogonal to an optical axis of the at least one lens, wherein the second set of current provided from the second component to the second set of coils includes current for at least a second coil to move the at least one lens relative to the image sensor along the optical axis of the at least one lens, wherein the third set of current provided from the first component to the third set of coils includes current for at least a third coil to rotate the at least one lens relative to the image sensor around a first axis orthogonal to the optical axis of the at least one lens, and wherein the fourth set of current provided by the second component to the fourth set of coils includes current for at least a fourth coil to rotate the at least one lens relative to the image sensor around a second axis orthogonal to the optical axis of the at least one lens.

6. The device of claim 1, wherein the at least one signal received at the first component from the controller includes at least one of (1) a first signal indicative of a position of the at least one lens relative to the image sensor along an optical axis of the at least one lens or along one axis orthogonal to the optical axis of the at least one lens, (2) a second signal indicative of a position of the image sensor relative to the at least one lens along an axis orthogonal to the optical axis of the at least one lens, or (3) a third signal indicative of an angle for the at least one lens relative to the image sensor around an axis orthogonal to the optical axis of the at least one lens.

7. The device of claim 1, wherein first component is configured to communicate with the second component using serial communication.

8. The device of claim 1, wherein the one or more actuators include at least one voice coil motor (VCM) actuator.

9. The device of claim 1, wherein prior to obtaining the at least one signal from the controller, the first and second components are initialized by the controller through serial communication.

10. The device of claim 1, wherein the first and second components each includes a driver circuit configured to regulate current for a coil of an actuator.

11. A method, comprising:
obtaining, at a first component of a camera, at least one signal;
obtaining, at the first component of the camera, one or more signals indicative of one or more sensor measurements;
determining, at the first component of the camera and based on the at least one signal and the one or more signals indicative of the one or more sensor measurements, (1) a first set of current for a first set of coils of one or more actuators of the camera and (2) a second set of current for a second set of coils of the one or more actuators for interacting with one or more magnets to move at least one of at least one lens or an image sensor of the camera;
providing, by the first component of the camera and to a second component of the camera, at least one signal indicative of the second set of determined current for the second set of coils of the one or more actuators of the camera; and
generating, by the first component of the camera, the first set of determined current to the first set of coils of the one or more actuators of the camera.

12. The method of claim 11, further comprising:
obtaining, at the second component of the camera, from the first component the at least one signal indicative of the second set of determined current for the second set of coils; and
generating, at the second component, the second set of determined current to the second set of coils of the one or more actuators.

13. The method of claim 12,
wherein the first set of current generated from the first component to the first set of coils includes current for at least a first coil to move the image sensor relative to the at least one lens along one or more axes orthogonal to an optical axis of the at least one lens, and
wherein the second set of current generated from the second component to the second set of coils includes current for at least a second coil to move the at least one lens relative to the image sensor along the optical axis of the at least one lens.

14. The method of claim 12,
wherein the first set of current generated from the first component to the first set of coils includes (1) current for at least a first coil to move the image sensor relative to the at least one lens along a first axis orthogonal to an optical axis of the at least one lens and (2) current for at least a second coil to move the image sensor relative to the at least one lens along the optical axis of the at least one lens, and
wherein the second set of current generated from the second component to the second set of coils includes current for at least a third coil to move the image sensor relative to the at least one lens along a second axis orthogonal to the optical axis of the at least one lens.

15. The method of claim 12,
wherein the first set of current generated from the first component to the first set of coils includes (1) current for at least a first coil to move the image sensor relative to the at least one lens along an axis orthogonal to an optical axis of the at least one lens and (2) current for at least a second coil to rotate the at least one lens relative to the image sensor around a first axis orthogonal to the optical axis of the at least one lens, and wherein the second set of current generated from the second component to the second set of coils includes (1) current for at least a third coil to move the at least one lens relative to the image sensor along the optical axis of the at least one lens and (2) current for at least a fourth coil to rotate the at least one lens relative to the image sensor around a second axis orthogonal to the optical axis of the at least one lens.

16. The method of claim 12, further comprising:

providing, at the first component, to a controller at least one of the one or more signals indicative of the one or more sensor measurements;

obtain, at the first component, from the controller at least one signal indicative of a third set of determined current for a third set of coils and at least one signal indicative of a fourth set of determined current for a fourth set of coils of the one or more actuators;

providing, from the first component, to the second component the at least one signal indicative of a fourth set of determined current for a fourth set of coils;

generating, at the first component, the third set of determined current to the third set of coils; and generating, at the second component, the fourth set of determined current to the fourth set of coils, wherein the first set of current generated from the first component to the first set of coils includes current for at least a first coil to move the image sensor relative to the at least one lens along an axis orthogonal to an optical axis of the at least one lens, wherein the second set of current generated from the second component to the second set of coils includes current for at least a second coil to move the at least one lens relative to the image sensor along the optical axis of the at least one lens, wherein the third set of current generated from the first component to the third set of coils includes current for at least a third coil to rotate the at least one lens relative to the image sensor around a first axis orthogonal to the optical axis of the at least one lens, and wherein the fourth set of current generated by the second component to the fourth set of coils includes current for at least a fourth coil to rotate the at least one lens relative to the image sensor around a second axis orthogonal to the optical axis of the at least one lens.

17. The method of claim 12, wherein the first and second components each includes a driver circuit configured to regulate current for a coil of an actuator, and wherein the one or more actuators include at least one voice coil motor (VCM) actuator.

18. The method of claim 11, wherein the at least one signal received at the first component includes at least one of (1) a first signal indicative of a position of the at least one lens relative to the image sensor along an optical axis of the at least one lens or along one axis orthogonal to the optical axis of the at least one lens, (2) a second signal indicative of a position of the image sensor relative to the at least one lens along an axis orthogonal to the optical axis of the at least one lens, or (3) a third signal indicative of an angle for the at least one lens relative to the image sensor around an axis orthogonal to the optical axis of the at least one lens.

19. A device, comprising:

at least one lens;

an image sensor to generate image signals based on light passing through the at least one lens;

a processor configured to process the image signals to produce an image; and a first controller configured to:
 obtain a first set of one or more signals from a first set of one or more sensors indicative of a first set of one or more sensor measurements;
 obtain a second set of one or more signals from a second controller indicative of a second set of one or more sensor measurements;
 determine, based at least in part on the first set of signals and the second set of signals, a first set of current for a first set of coils of one or more actuators for interacting with one or more magnets to move at least one of the at least one lens or the image sensor; and
 generate the first set of determined current to the first set of coils of the one or more actuators; and the second controller configured to:
 obtain the first set of signals from the first controller indicative of the first set of sensor measurements;
 obtain the second set of signals from a second set of one or more sensors indicative of the second set of sensor measurements;
 determine, based at least in part on the first set of signals and the second set of signals, a second set of current for a second set of coils of the one or more actuators for interacting with the one or more magnets to move at least one of the at least one lens or the image sensor; and
 generate the second set of determined current to the second set of coils of the one or more actuators.

20. The device of claim 19, wherein the first set of current provided from the first controller to the first set of coils includes current for at least a first coil to:
 move the image sensor relative to the at least one lens along one or more axes orthogonal to an optical axis of the at least one lens;
 move the at least one lens relative to the image sensor along the optical axis of the at least one lens; or
 rotate the at least one lens relative to the image sensor around one or more axes orthogonal to the optical axis of the at least one lens, and wherein the second set of current provided from the second controller to the second set of coils includes current for at least a second coil to:
 move the image sensor relative to the at least one lens along the one or more axes orthogonal to the optical axis of the at least one lens;
 move the at least one lens relative to the image sensor along the optical axis of the at least one lens; or
 rotate the at least one lens relative to the image sensor around the one or more axes orthogonal to the optical axis of the at least one lens.

* * * * *